United States Patent
Jacobs et al.

(10) Patent No.: US 7,865,319 B1
(45) Date of Patent: Jan. 4, 2011

(54) FIXTURE DE-EMBEDDING METHOD AND SYSTEM FOR REMOVING TEST FIXTURE CHARACTERISTICS WHEN CALIBRATING MEASUREMENT SYSTEMS

(75) Inventors: Lawrence W. Jacobs, Beaverton, OR (US); Peter J. Pupalaikis, Ramsey, NJ (US)

(73) Assignee: LeCroy Corporation, Chestnut Ridge, NY (US)

( * ) Notice: Subject to any disclaimer, the term of this patent is extended or adjusted under 35 U.S.C. 154(b) by 350 days.

(21) Appl. No.: 11/998,523

(22) Filed: Nov. 30, 2007

Related U.S. Application Data (60) Provisional application No. 60/861,900, filed on Nov. 30, 2006.

(51) Int. Cl.
*G01R 27/32* (2006.01)
*G06F 17/16* (2006.01)

(52) U.S. Cl. .......................... 702/57; 702/65; 702/117; 702/118; 324/537; 324/600; 324/638

(58) Field of Classification Search .................. 702/57, 702/65, 117, 118, 124, 126
See application file for complete search history.

(56) References Cited

U.S. PATENT DOCUMENTS

| | | | |
|---|---|---|---|
| 6,650,123 B2 * | 11/2003 | Martens | 324/601 |
| 6,665,628 B2 | 12/2003 | Martens | |
| 6,785,625 B1 | 8/2004 | Fan et al. | |
| 6,832,170 B2 | 12/2004 | Martens | |
| 7,127,363 B2 * | 10/2006 | Loyer | 702/57 |
| 7,389,191 B2 * | 6/2008 | Furuya et al. | 702/65 |
| 2007/0040561 A1 * | 2/2007 | Kamitani | 324/601 |
| 2007/0073499 A1 * | 3/2007 | Sawyer et al. | 702/75 |
| 2008/0281542 A1 | 11/2008 | Tan | |

OTHER PUBLICATIONS

Agilent Technologies, "Agilent PN 8720-2; In-fixture Microstrip Device Measurements Using TRL* Calibration; Product Note," 2000, 17 pages, Agilent Technologies, U.S.A.

Lecroy Corporation, "Instruction Manual; LeCroy WaveLink Series Differential Probes," Nov. 2006, Revision D, LeCroy Corporation, U.S.A.

Vendelin, George D., "Design of Amplifiers and Oscillators by the S-Parameter Method," 1992, pp. 6-15, John Wiley & Sons, New York, U.S.A.

Kurokawa, K., "Power Waves and the Scattering Matrix," IEEE Transactions on Microwave Theory and Techniques, Mar. 1965, pp. 194-202, U.S.A.

(Continued)

*Primary Examiner*—Hal D Wachsman
(74) *Attorney, Agent, or Firm*—Law Office of Karen Dana Oster, LLC (57) ABSTRACT

A method and system for measuring the input (loading) impedance of measurement systems using a test fixture. This is done by first measuring the characteristics of an unloaded test fixture to obtain scattering parameters of the test fixture and using a splitting algorithm to calculate the scattering parameters of each transmission line leg of the test fixture. The test fixture is then measured with a measurement system attached. The test fixture effects defined by the scattering parameters are then removed from the measurement to yield the scattering parameters of the measurement system alone (measurement system effects).

18 Claims, 10 Drawing Sheets

OTHER PUBLICATIONS

Elmore, Glenn, "De-Embedded Measurements Using the HP 8510 Microwave Network Analyzer," RF & Microwave Measurement Symposium and Exhibition, Aug. 1985, 23 pages, Hewlett Packard, U.S.A.

Bahc, Inder et al., "Microwave Solid State Circuit Design," Appendix C: ABCD and S-Parameters, 1988, pp. 892-896, Wiley-Interscience, U.S.A.

Agilent Technologies, "Agilent De-embedding and Embedding S-Parameter Networks Using a Vector Network Analyzer; Application Note 1364-1," 2004, 24 pages, Agilent Technologies, U.S.A.

Anritsu, "Techniques for VNA Measurements of Non-insertable Devices," 2005, 15 pages, www.us.anritsu.com.

Agilent Technologies, "Users Guide; 1169A 12 GHz InfiniiMax Differential and Single-ended Probe," Sep. 2005, Agilent Technologies, U.S.A.

Agilent, De-mbedding and Embedding S-Parameter Networks Using a Vector Network Analyzer, Application Note 1364-1, May 30, 2004, 24 pages.

Tan, Kan; "Calibration of a Partially Symmetric Fixture"; U.S. Appl. No. 60/916,872; May 9, 2007; 8 pages; USPTO; USA.

* cited by examiner

FIXTURE DE-EMBEDDING METHOD AND SYSTEM FOR REMOVING TEST FIXTURE CHARACTERISTICS WHEN CALIBRATING MEASUREMENT SYSTEMS

The present application is an application claiming the benefit under 35 USC Section 119(e) of U.S. Provisional Patent Application Ser. No. 60/861,900, filed Nov. 30, 2006. The present application is based on and claims priority from this application, the disclosure of which is hereby expressly incorporated herein by reference in its entirety.

BACKGROUND OF INVENTION

The present invention relates to the calibration and test of electrical test probes, and more specifically to a fixture de-embedding method and system for removing test fixture characteristics when calibrating measurement systems.

Electrical signals are the blood that flows through electrical components (e.g. integrated circuits and other electronic devices). Connection mechanisms such as wires, traces, leads, legs, pins, vias, or other connection mechanisms act as the veins and arteries through which the signal blood flows. Electrical test probes (or just "probes") are used to provide an electrical connection between electrical components and/or connection mechanisms (jointly referred to as "test points" or devices-under-test (DUTs)) and the testing instruments (e.g. oscilloscopes) that measure, monitor, diagnose, and/or process the signals. An electronic test probe generally consists of a probing head, a cable, and a probe connector. The probing head may have an integral or replaceable probing tip that is suitable for making an electronic contact with DUTs. The probing head is attached to a first end of the cable and the connector is attached to the opposite end of the cable. Electrical test probes may be an "active" probe or a "passive" probe. Electrical test probes may be single-ended (having a signal contact and a reference or ground contact) or differential (having two signal contacts). High impedance (microwave) probes are electrical test probes in which the impedance at the probing tip is much higher than the impedance of the DUT at the point of probing tip contact. The term "measurement system" will be used herein to describe the combination of electrical test probes (such as high impedance probes) and testing instruments.

When taking electrical measurements (or otherwise monitoring, diagnosing, and/or processing signals), it is vital that the characteristics of the measurement system do not affect the accuracy of the measured data. Accordingly, the measurement system is ideally designed to be as close to perfect as possible. For example, for high impedance probes that measure voltages at test points, the probe impedance is designed to be high enough so that connection of the probe will make no change to the voltage in the DUT (i.e. the impedance of the probe can be assumed to be insignificant compared to the test fixture impedance and, therefore, can be neglected). Another example is that the transfer characteristic (the relationship between the voltage at the probing tip (input) and the output (e.g. the display)) of the measurement system is designed so that the voltage measured by the measurement system is exactly the same as (equal to) the voltage present at the point of probing tip contact (i.e. a perfectly flat frequency response). As the frequency of the voltages (signals) being measured increases, however, it becomes impossible to make a measurement system with impedance high enough so that the voltage at the point of probing tip contact of the DUT is unaffected by probing tip contact. Likewise, the transfer characteristic might vary with frequency, further degrading the accuracy of measurements taken with the measurement system. It is important to be able to accurately measure the effects of the impedance and the transfer characteristics (hereinafter referred to jointly as the "measurement system effects") so that the accuracy of the measurement can be determined and/or improved through processing the measured data.

Many techniques exist to accurately measure insertable devices (e.g. devices that have standard male-female connectors that allow a test fixture to be inserted) as the DUT. When a measurement system (such as a Vector Network Analyzer (VNA)) is used to measure insertable devices, measurements are first made of several known standards, the most common being "short-open-load-through" (SOLT). From these measurements, the characteristics of the measuring system can be determined or calibrated. When the insertable device is then inserted between the test fixture ports (e.g. coaxial ports), the effects of the measurement system can be removed so that the DUT response alone can be displayed with no deviation due to measuring system imperfection.

The technique described above (as well as other known techniques in which multiple standards are applied) can be extended to situations that are not technically "insertable" such as assuming equal adapters or "Transverse ElectroMagnetic" (TEM) environments. (TEM environments have no electric or magnetic field in the direction of propagation.) Techniques used in these situations might include additional measurement standards (such as equal length thru paths or transmission line) or non-TEM calibration methods (such as TRL (thru-reflect-line)). All of these methods, however, require the connection between test fixture source port(s) (the signal source(s)) and test fixture response port(s) (the signal response(s)) to be broken (disconnected) so that different elements (e.g. different lengths of thru line or open-circuited transmission lines) can be inserted between the ports.

For purposes of this disclosure, measurement systems (including high impedance probes) are non-insertable and non-TEM devices. High impedance probes are designed to have a very high input impedance so that the signal (voltage) under test is not altered when the probing tip contacts the DUT being measured. These high impedance probes have traditionally been evaluated with specific test fixtures that interface with the probing tip to a fixed low impedance. For example, a test fixture usually has coaxial input ports facilitating measurement with a measurement system (e.g. a Vector Network Analyzer (VNA) or a time domain reflectometer (TDR)). The measurement system is calibrated to the reference plane of the test fixture input, and measurements are made of the high impedance probe and the test fixture. The test fixture is assumed to be perfect so that the resulting measurement is assumed to apply to the high impedance probe in parallel with the termination impedance (e.g. 50Ω). With a lower impedance test fixture, the impedance of the high impedance probe is assumed to be insignificant compared to the test fixture impedance and is neglected. Likewise, the test fixture is assumed to have perfectly flat frequency response. At high frequencies, however, neither of these assumptions is valid: the high impedance probe loading impedance alters the voltage present at the probing tip, and the transfer characteristic of the measurement system is dependant upon the specific implementation of the test fixture. At microwave frequencies the input or loading impedance of the high impedance probes can no longer be modeled as a simple parallel R-C circuit. In particular, since probe input impedance is designed to be much higher than 50Ω, the test fixture effects must be known precisely in order to accurately measure the small changes induced by the probe. A more detailed model is required that is valid throughout the operating frequency range of the high impedance probe. The probe impedance must be accurately measured throughout this frequency range in order to create this model.

BRIEF SUMMARY OF THE INVENTION

The present invention is directed to a method and system for accurately measuring the input (loading) impedance of measurement systems using a test fixture.

A test fixture used with the present invention preferably includes at least one transmission line, each at least one transmission line having a port at two ends. Each test fixture has a plurality of transmission line legs, each transmission line leg extending between a mid-point reference plane of the at least one transmission line and a port. Characteristics of an unloaded test fixture are preferably measured to obtain scattering parameters of the test fixture, the scattering parameters arranged in at least one scattering matrix. Then, the scattering parameters of each transmission line leg of the test fixture may be calculated. The test fixture loaded with a measurement system attached is measured to produce a combined measurement of the test fixture and the measurement system. Finally, the test fixture effects defined by the scattering parameters are removed from the combined measurement by calculation to obtain measurement system effects of the measurement system alone.

In preferred embodiments, calculating the scattering parameters of each transmission line leg of the test fixture is accomplished using a splitting algorithm. The splitting algorithm includes the following steps: determining a line impedance of each transmission line; renormalizing the at least one scattering matrix of the unloaded test fixture to obtain at least one renormalized scattering matrix of the unloaded test fixture; determining at least one input reflection coefficient of a pair of split matrices for each the transmission line using the at least one renormalized scattering matrix; solving for the remaining parameters of the pair of split matrices using the at least one renormalized scattering matrix and the input reflection coefficients of the pair of split matrices; and normalizing the pair of split matrices to 50Ω.

The foregoing and other objectives, features, and advantages of the invention will be more readily understood upon consideration of the following detailed description of the invention, taken in conjunction with the accompanying drawings.

DETAILED DESCRIPTION OF THE INVENTION

At microwave frequencies, test fixtures can no longer be assumed perfect because of the test fixture effects. Prior art has ignored the effects of the test fixtures. There are, however, two options to remove test fixture effects: (1) the measurement can be calibrated to the reference plane where the probing tip makes contact with the test fixture, or (2) the response of the test fixture on either side of the probing tip can be removed from the measurement. The first option is difficult due to the challenges of creating appropriate calibration standards and a test fixture that can be separated at the reference plane. The second option requires determination of the parameters (that define the test fixture effects) for each leg (the portion of the transmission line or trace that extends from the input port to the point of probing tip contact) of the test fixture using some inexact means. Preferred embodiments of the present invention provide new and novel more exact means for determining the parameters (that define the test fixture effects) for each transmission line leg of the test fixture.

A new method and system are described to accurately measure the input (loading) impedance of measurement systems that include high impedance probes and testing instruments. This is done by first measuring the characteristics of an unloaded test fixture to obtain scattering parameters of the test fixture (the scattering parameters arranged in at least one scattering matrix) and using a novel splitting algorithm to calculate the scattering parameters of each transmission line leg of the test fixture. The test fixture is then measured with a measurement system attached. The test fixture effects defined by the scattering parameters are then removed from the measurement to yield the scattering parameters of the measurement system alone (measurement system effects).

Put another way, one preferred purpose of the present invention is to determine the accuracy of a measurement system. To find a solution, a test fixture is constructed (or otherwise provided or obtained) that provides a point of probing tip contact between a known signal and the probing tip. Next, a means to measure the test fixture is used to determine the test fixture's precise characteristics. Preferred embodiments of the present invention use a unique means for accomplishing the measurement of the test fixture—specifically splitting the test fixture without breaking (disconnecting) the test fixture using a unique "splitting algorithm." A means to measure (e.g. using a VNA or a TDR) is then used to determine the precise characteristics of the measurement system in conjunction with the test fixture. Finally, a means to remove (de-embedding by calculation) the test fixture's effects from the joint measurement is used to leave only the measurement of the measurement system. The resulting measurement of the measurement system (the measurement system effects) is the added impedance at the point the probing tip contacts a DUT and the transfer characteristics of the measurement system—the two characteristics that define the accuracy of the measurement system.

Preferred embodiments of the present invention, therefore, include a test fixture and measurement method that will allow the imperfections of the test fixture (the test fixture effects) to be removed (by calculation) from the measurement such that the voltage present at the probing tip and the transfer characteristic of the measurement system can be accurately determined. Another preferred embodiment of the present invention is to provide a test fixture and measurement method whereby the measurement system loading impedance can be accurately measured. Yet another preferred embodiment of the present invention is directed to a new method for determining the parameters of the test fixture legs from a measurement of the entire test fixture. These methods can be implemented without requiring calibration standards or breaking (disconnecting) the test fixture at the reference plane. The response of the test fixture (test fixture effects) can then be removed (by calculation) from a measurement of the measurement system in the test fixture so that the resulting response is that of the measurement system alone.

The Test Fixture

The highest frequency test fixtures are transmission line based with port connectors to allow connection to the measurement system. The measurement system can be calibrated to the reference planes of the port connectors. Calibration to the point of probing tip contact is more difficult because the test fixture cannot easily be broken (disconnected) at the point of probing tip contact to insert known calibration standards. In addition, it is very difficult to make accurate standards in a microstrip (non-TEM) environment.

On the other hand, because it is relatively easy to print metal traces accurately, test fixtures can be made that have constant line impedance and good physical symmetry. The variation from port to port of the test fixture is dominated by the port connectors-to-microstrip transition at the port connector interface.

At high frequencies, the parasitics/loading of the measurement system will interact with the environment of the DUT. This means that the measurement system characteristics will vary depending on the specific DUT construction (i.e. trace width, dielectric constant of substrate, thickness, etc.) In order to obtain the most accurate information about the measurement system, the test fixture should have characteristics identical to the DUT.

Figure 1:
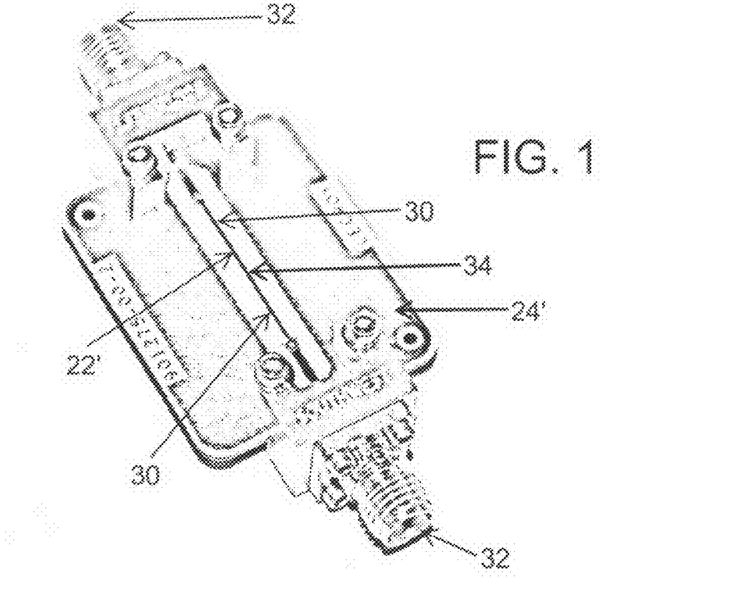
FIG. 1 is a perspective plan view of an exemplary printed substrate having a single transmission line for use with a single-ended test fixture.
Figure 2:
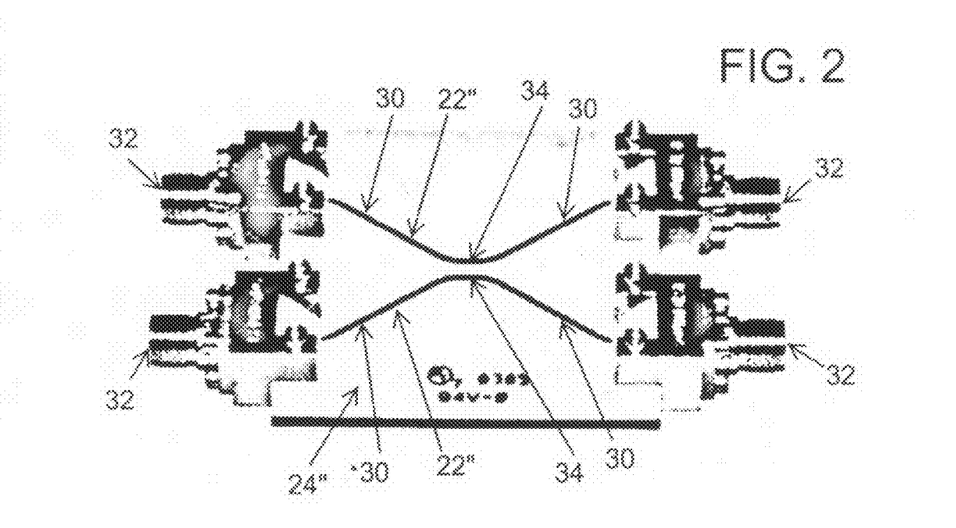
FIG. 2 is a perspective plan view of an exemplary printed substrate having two transmission lines for use with a differential test fixture.
Figure 3:
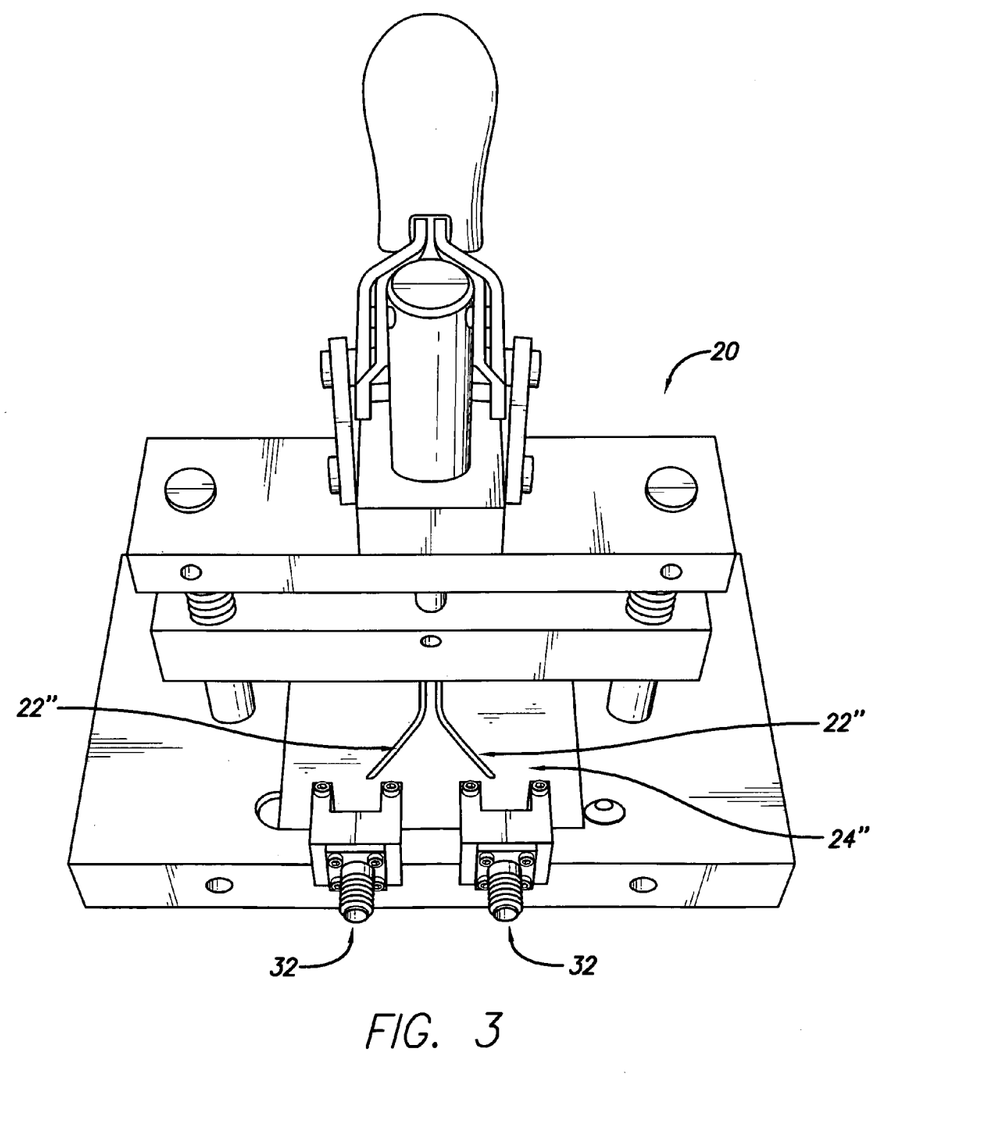
FIG. 3 is a perspective front view of an exemplary differential test fixture with a printed substrate such as that shown in FIG. 2 positioned therein.

As shown in FIGS. 1-3, an exemplary test fixture 20 for a measurement system will consist of a microstrip transmission line 22' and ground (for a single-ended probe) or two transmission lines 22" (for a differential probe). A printed substrate 24 (shown as 24' and 24") can be made that has transmission line(s) 22', 22" with uniform impedance and launches for port connectors to interface with a measurement system. FIG. 1 shows an exemplary substrate 24' of a single-ended test fixture. FIGS. 2 and 3 show an exemplary substrate 24" of a differential test fixture and an exemplary differential test fixture 20.

Accordingly, a test fixture constructed using known methods to print metal traces on a substrate are suitable for providing a point of probing tip contact between a known signal and the probing tip. It should be noted that the present invention should not be limited to construction of a test fixture using printed substrates as there are many known methods for constructing test fixtures that would be suitable for constructing a test fixture for use with the present invention.

Calculation of Split Scattering Parameters

In order to de-embed the test fixture response from a measurement of the combined measurement (of the measurement system in conjunction with the test fixture), the scattering parameters (test fixture response) of each transmission line leg needs to be calculated. A "transmission line leg" 30 of the test fixture extends from each port 32 to the point of probing tip contact 34 (also discussed herein as the "reference plane"). In order to calculate the scattering parameter (response) of each transmission line leg 30 of the test fixture, two simple assumptions about the test fixture are required. First, the point of probing tip contact 34 will be the electrical center of the test fixture (mid-point reference plane), so the substrate should be physically symmetrical about the probing tip contact point (although it is assumed that each port connector-to-microstrip transition will have unique characteristics). Second, the impedance of the transmission lines must be uniform around the point of probing tip contact 34 (although the specific impedance does not have to be known). A differential test fixture for use with preferred embodiments of the present invention is designed so that the coupling between traces is small enough to be neglected.

Figure 4:
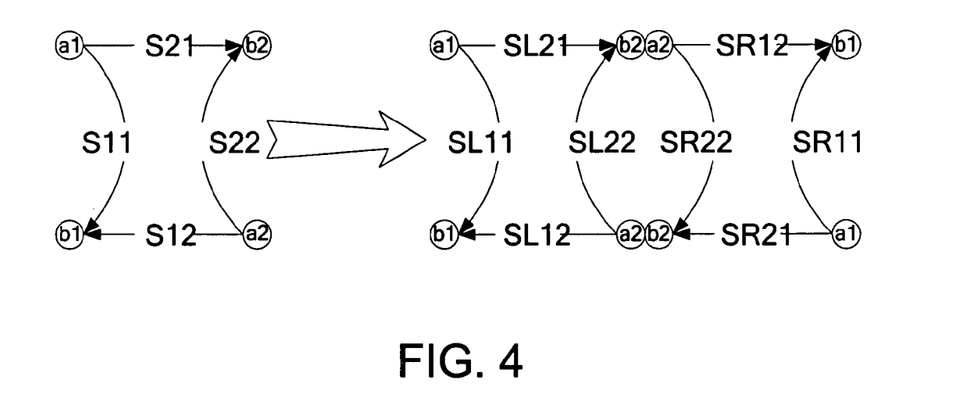
FIG. 4 is a flow graph of a scattering matrix being split into two matrices, the left side showing the signal flow graph of the left half of the "split" test fixture and the right side showing the signal flow graph of the right half of the "split" test fixture.

The scattering parameters (also referred to as "S-parameters") of the entire test fixture are measured (or otherwise obtained). The scattering parameters of the test fixture are arranged in at least one scattering matrix. For a single-ended test fixture (having a single thru path) there will be a single 2-port scattering matrix (also referred to as an "S matrix"). For a differential test fixture, each thru path is measured, resulting in two 2-port scattering matrices. The left side of FIG. 4 shows the signal flow graph of a 2-port test fixture. A 4-port fixture can be treated as a pair of uncoupled 2-port fixtures.

Each scattering matrix will then be split into two to represent the response (scattering matrix) of each transmission line leg 30 of the test fixture. The right side of FIG. 4 shows the signal flow graph of the "split" test fixture. For a differential test fixture, there would be four scattering matrices representing the four transmission line legs 30 of the test fixture.

Figure 5:
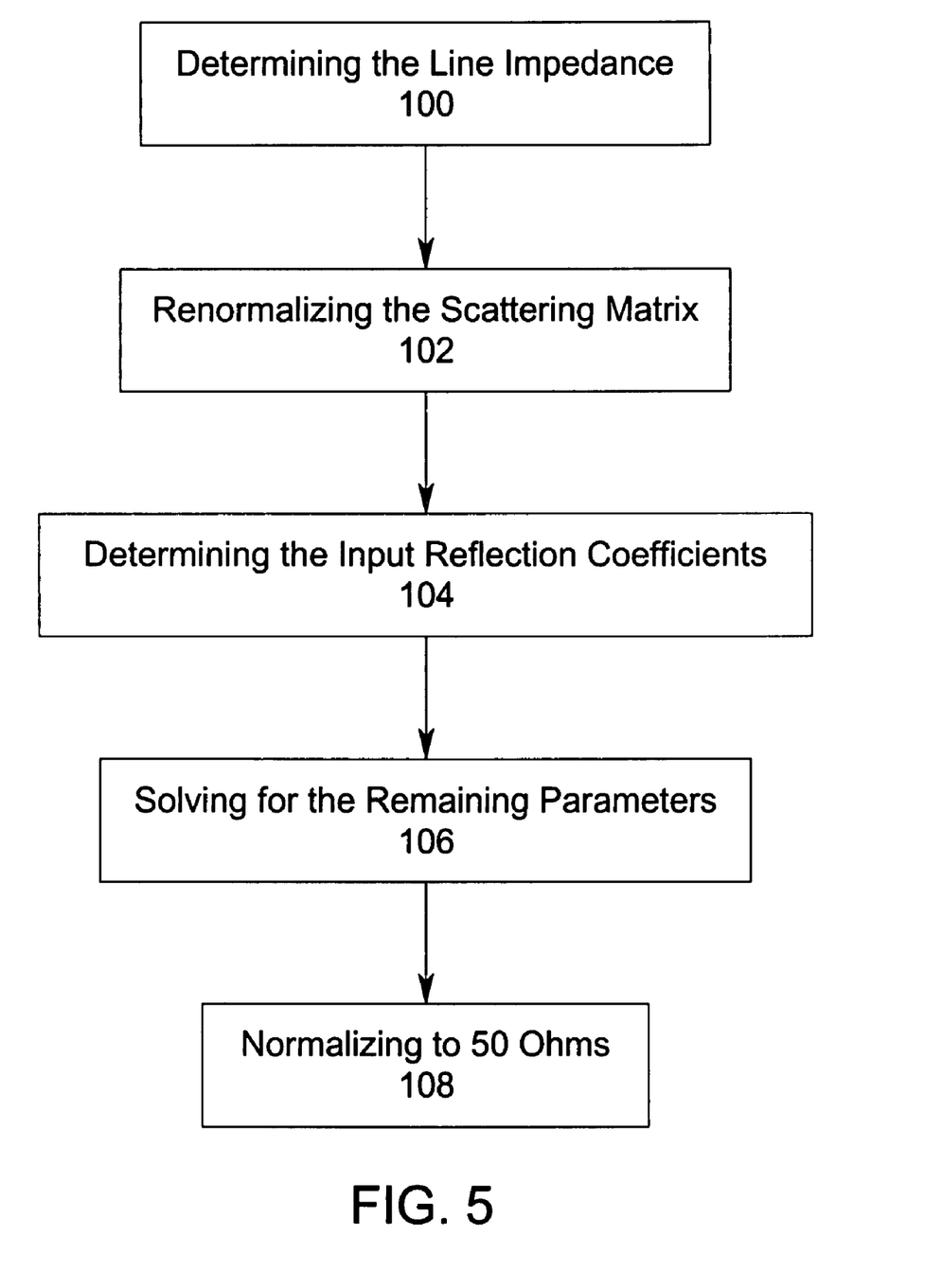
FIG. 5 is a flow chart showing preferred exemplary steps of the calculation of the SL and SR matrices from the scattering matrix.

The calculation of the SL and SR matrices (the left split (SL) and the right split (SR) matrices on the right side of FIG. 4) from the scattering matrix is performed using the steps shown in FIG. 5 that provide a broad outline of a preferred embodiment of the splitting algorithm of the present invention. (It should be noted that the L and R designations are arbitrary and could be replaced with alternative variables without affecting the scope of the invention.) Specifically, the calculation of the SL and SR matrices from the scattering matrix is performed using the following steps: determining the line impedance 100, renormalizing the scattering matrix 102, determining the input reflection coefficients 104, solving for the remaining parameters 106, and normalizing to 50Ω 108.

Determining the Line Impedance 100: After obtaining the characteristics (scattering parameters) of the entire test fixture, the first step is to correct for the non-ideal transmission line impedance. The electrical length (group delay) of the test fixture in calculated from either thru response (S21 or S12). Next, the input reflection (either side) is converted into the time domain (impulse response). This can be done, for example, by calculating the Fourier Transform of the input reflection coefficient (S11 or S22). A time domain window (gate) is then applied to the transformed reflection (impulse response) and the result is integrated to calculate the reflection (ρ) at the test fixture center (mid-point reference plane). (The window width is equal to the electrical length of the test fixture, and centered at t=0.) The transmission line impedance (Zms) is calculated from this reflection coefficient using the following equation:

$$Zms = 50\Omega \cdot \frac{1+\rho}{1-\rho} \quad (1)$$

Figure 6:
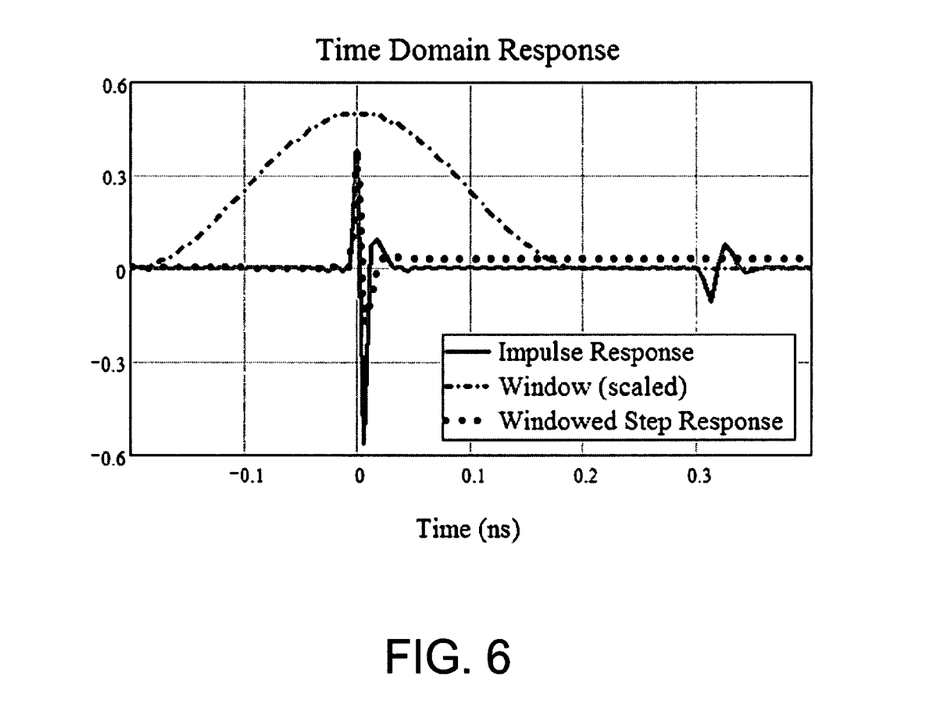
FIG. 6 is a graph showing the plot of the impulse response, the window (scaled), and the windowed step response of the exemplary test fixture.

FIG. 6 shows a plot of an impulse response window function (e.g. a time domain range within which the impulse response is preserved, but outside of which the impulse response is removed or brought to zero) with the window width set to the electrical length of the test fixture and the step response is calculated from the windowed impulse response. Specifically, FIG. 6 shows the plot of the impulse response, the window (scaled), and the windowed step response of the test fixture. It should be noted that the impulse response is multiplied by the window function and integrated to obtain the windowed step response of the test fixture. The window height is scaled by 0.5 for more convenient display.

Renormalizing the Scattering Matrix 102: The original scattering matrix [S] is renormalized to Zms yielding a new renormalized scattering matrix [Sr] (the lowercase "r" being used to designate "renormalized"). This is done so that the reference plane (which corresponds to the point of probing tip contact 34) can be assumed to be perfectly matched (locally) to the reference impedance Zms when the test fixture is split.

Determining the Input Reflection Coefficients 104: The same Fourier Transform/time domain gating process is then applied to the renormalized matrix [Sr]. The gated responses of both inputs (Sr11 and Sr22) are then transformed back into the frequency domain. The result is the new input reflection coefficients for the split matrices—SLr11 and SRr11 (the lowercase "r" indicating that values are normalized to Zms).

Solving for the Remaining Parameters 106: The remaining six parameters can be calculated by setting the cascade of [SLr] and [SRr] equal to [Sr]. The four transfer terms (SRr12, SRr21, SLr12, and SLr21) are assumed to be equal (denoted SArxy) since the reference plane is the electrical center of the test fixture (mid-point reference plane). The equations simplify to:

$$SRr22 = \frac{Sr11 - SLr11}{\sqrt{Sr12 \cdot Sr21}} \quad (2)$$

$$SLr22 = \frac{Sr22 - SRr11}{\sqrt{Sr12 \cdot Sr21}} \quad (3)$$

$$SArxy = \sqrt{\sqrt{\sqrt{Sr12 \cdot Sr21}(1-SRr22 \cdot SLr22)}} \quad (4)$$

Care must be taken when computing the square root of the complex values. The numbers are expressed in polar form, and the phase is "extended" from the principle value so that it becomes continuous. Then the square root can be calculated by taking the square root of the magnitude and dividing the angle by 2.

Normalizing to 50Ω 108: The resulting scattering matrices ([SLr] and [SRr]) are then normalized back to 50Ω so that they can be used with measured data. The resulting matrices are the left and the right split matrices on the right side of FIG. 4.

Verification with Test Fixture Model

In order to demonstrate the enablement of this method, a model for a test fixture is created (e.g. using a linear microwave simulator) for simulation. The scattering parameters of the whole test fixture are then calculated. The scattering parameters of the whole test fixture are then split using the splitting method shown in FIG. 5 and the result compared to the known response of the test fixture half as simulated. A load is added at the reference plane and the de-embedded response compared to the known value.

Figure 7:
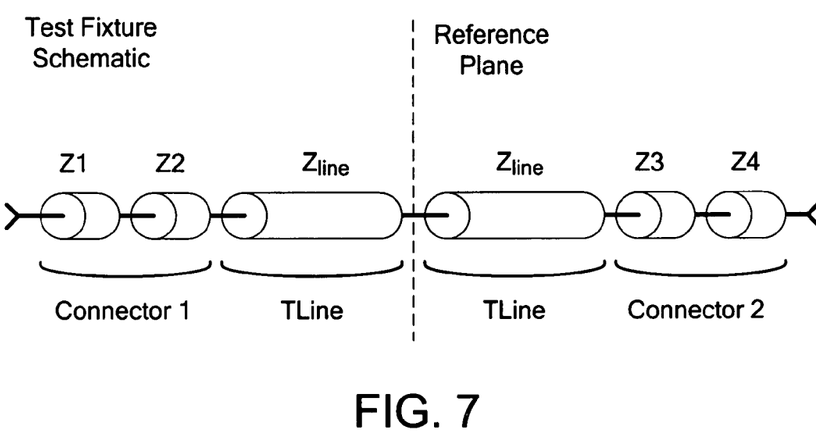
FIG. 7 is a simplified block diagram of an exemplary test fixture model.
Figure 8:
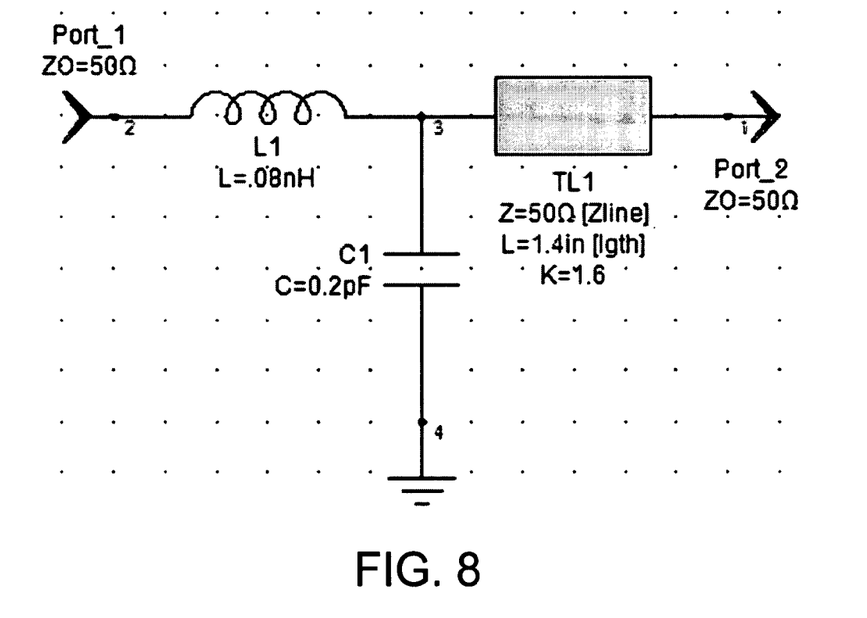
FIGS. 8 and 9 are simplified circuit diagrams of an alternative exemplary test fixture model, each figure showing a half of the test fixture on one side of the reference plane.
Figure 9:
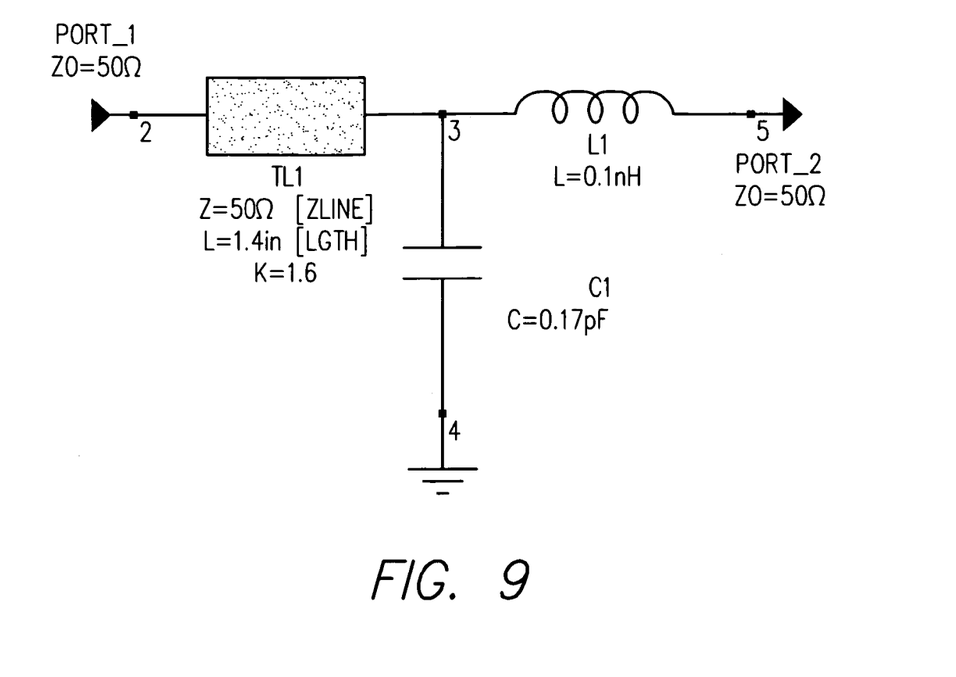
Figure 10:
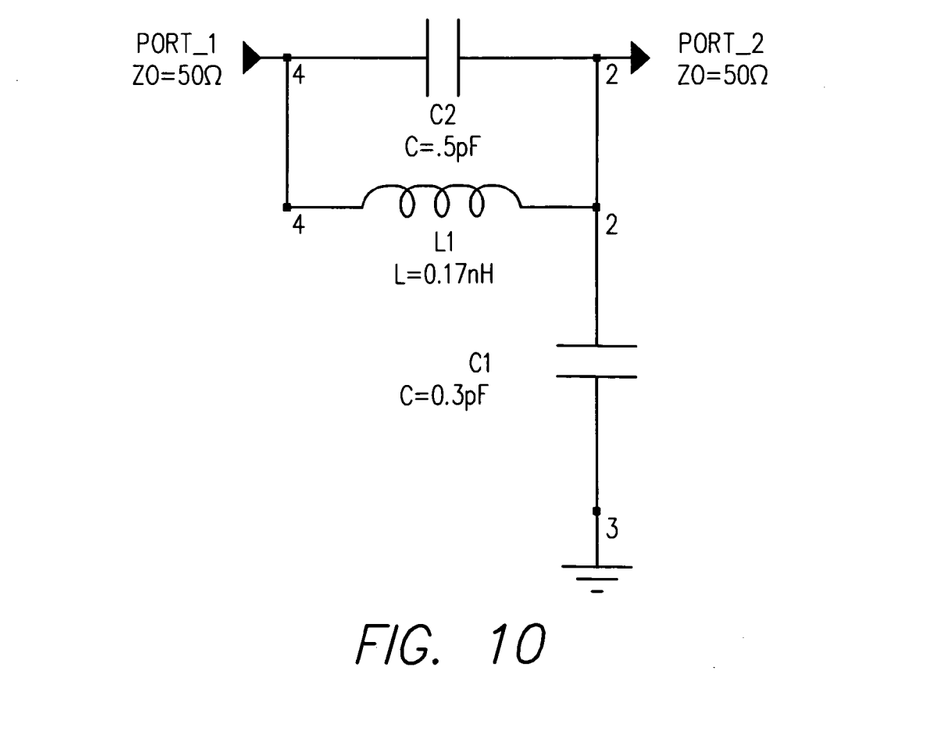
FIG. 10 is a simplified circuit diagram of an exemplary load to be applied at the reference plane of a test fixture model.

An exemplary test fixture model comprises stepped lossy transmission line elements, shown in FIG. 7. In this figure, the simulated test fixture model consists of equal (in length and impedance) transmission line segments (TLine) representing the printed lines and unequal short sections (Z1-Z4) representing the port connectors. The two lossy transmission line elements on each side of the reference plane represent the port connector-to-microstrip transitions. The two lossy transmission line elements are different on each side of the reference plane. The main transmission lines (TLine) are equal in length and impedance. FIGS. 8 and 9 show an alternative model of FIG. 7. FIG. 8 shows a structure alternative to the left side of the reference plane of FIG. 7 and FIG. 9 shows a structure alternative to the left side of the reference plane of FIG. 7. FIG. 10 shows an exemplary load (DUT) that may be applied at the reference plane.

Figure 11:
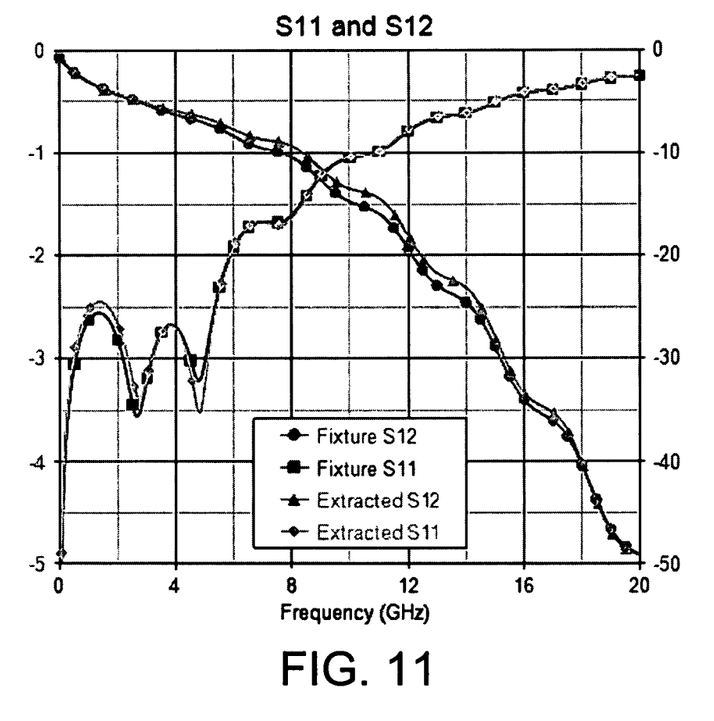
FIG. 11 is a graph showing that the insertion and return losses of the exact test fixture half are in very close agreement with the half extracted from the full test fixture.

The splitting algorithm is applied to the scattering parameters of the full test fixture. The parameters of the calculated test fixture halves are compared to the simulation of each test fixture half with very close agreement shown in FIG. 11. Specifically, FIG. 11 shows that the insertion and return losses of the exact test fixture half is in very close agreement with the half extracted from the full test fixture.

The de-embedding is checked by cascading the inverse of each test fixture half with the response of the full unloaded test fixture. This is done by converting the scattering matrices into transfer form (T-parameters); SL is converted to TL, SR to TR, and S to T. The transfer matrix (T-matrix) for each transmission line leg 30 of the test fixture is inverted, and then the three matrices are multiplied:

$$[TL]^{-1} \cdot [S] \cdot [TR]^{-1} \quad (5)$$

Figure 12:
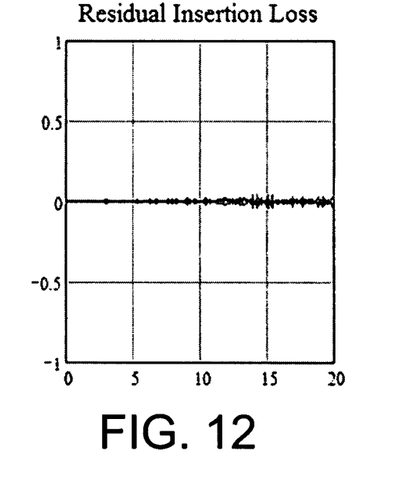
FIG. 12 is a graph showing residual insertion loss of the test fixture after the effects of the test fixture (obtained using a splitting algorithm of the present invention) have been de-embedded from a measurement of the test fixture alone.
Figure 13:
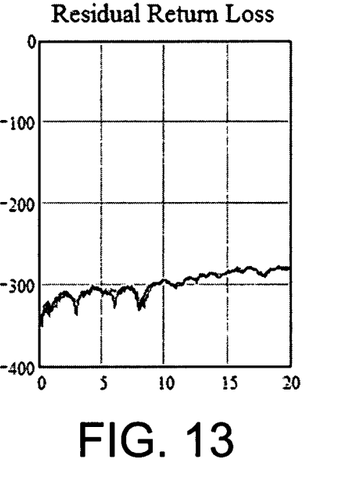
FIG. 13 is a graph showing residual return loss of the test fixture after the effects of the test fixture (obtained using a splitting algorithm of the present invention) have been de-embedded from a measurement of the test fixture alone.

This result is converted back to scattering parameters where the expected result should be that of an ideal short circuit. As shown in FIGS. 12 (residual insertion loss) and 13 (residual return loss), the response from a cascade of the de-embedding matrices with the full fixture response shows very low residual error.

Figure 14:
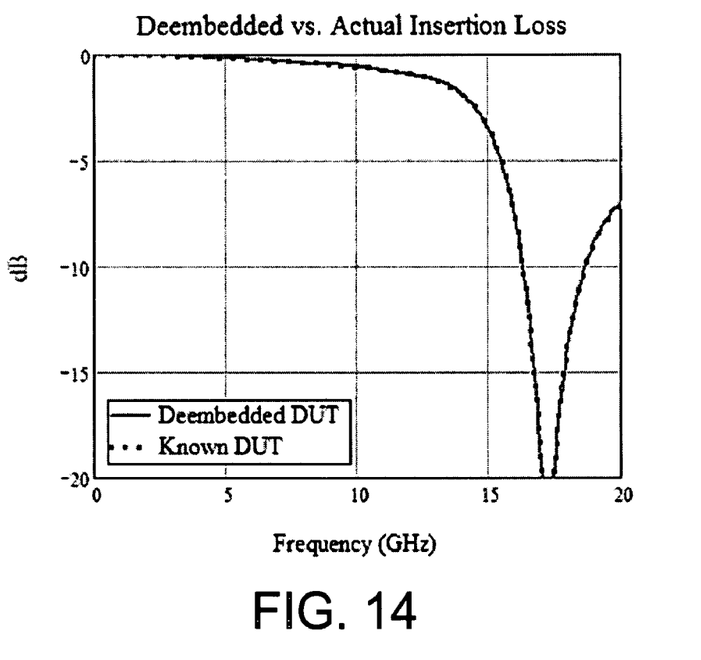
FIG. 14 is a graph showing the insertion loss as extracted from the response of the DUT in the test fixture model and simulated from the DUT alone.
Figure 15:
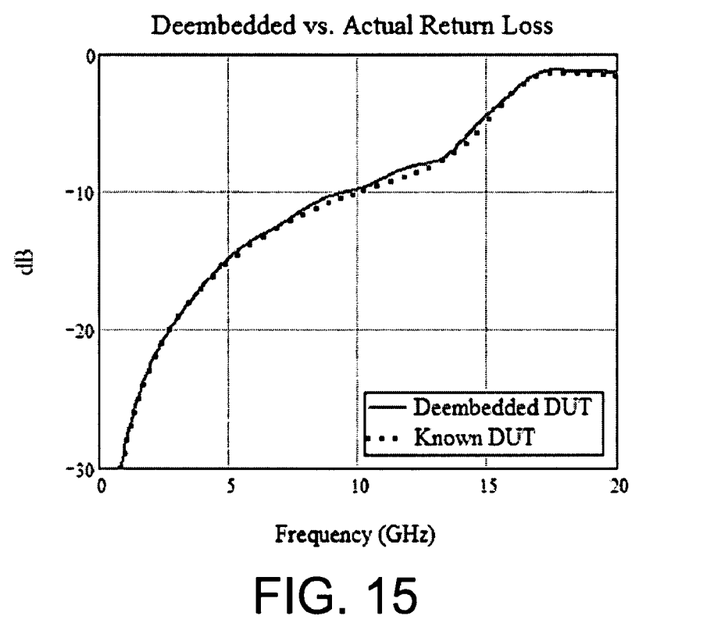
FIG. 15 is a graph showing the return loss as extracted from the response of the DUT in the test fixture model and simulated from the DUT alone.

In the simulation environment, an arbitrary DUT impedance (e.g. such as that shown in FIG. 10) is placed between the two test fixture halves (e.g. at the reference plane) and the resulting scattering parameters calculated. The previously extracted test fixture halves are de-embedded from the scattering parameters to yield the response of the DUT alone. When the response (the combined response with the fixture halves de-embedded) is plotted against the simulated response of the DUT alone the responses are shown as having very good agreement. FIG. 14 shows the insertion loss as extracted from the response of the DUT in the test fixture model and simulated from the DUT alone. FIG. 15 shows the return loss as extracted from the response of the DUT in the test fixture model and simulated from the DUT alone.

Example Measurement

One preferred embodiment of a method of the present invention was used to measure the input (loading) impedance of a measurement system. The differential test fixture of FIGS. 2 and 3 was used to perform the measurement. As discussed above, the test fixture has two transmission lines, each transmission line having a port 32 at both ends. The two halves of the transmission line(s) are the two transmission line legs (each transmission line leg extending between a mid-point reference plane of the transmission line and a port 32).

In this exemplary embodiment, an unloaded test fixture is measured. Specifically, the two 2-port measurements of the thru paths (transmission lines) were conducted, one for each thru path. From these measurements, four de-embedding 2-port scattering matrices (denoted [E]-[H] in FIG. 16) were calculated using the splitting algorithm of FIG. 5. The four de-embedding 2-port scattering matrices represent the four transmission line legs 30 of the differential test fixture.

The test fixture was then connected to a measurement system to make a full 4-port measurement of the measurement system in conjunction with the test fixture (to obtain a combined measurement).

The resulting data (the full 4-port combined measurement) then has the corresponding 2-port data removed (de-embedded by calculation) from each port 32 (the result of which is shown graphically in FIG. 16) to create a measurement de-embedded to the reference plane at the test fixture center (mid-point reference plane).

Figure 16:
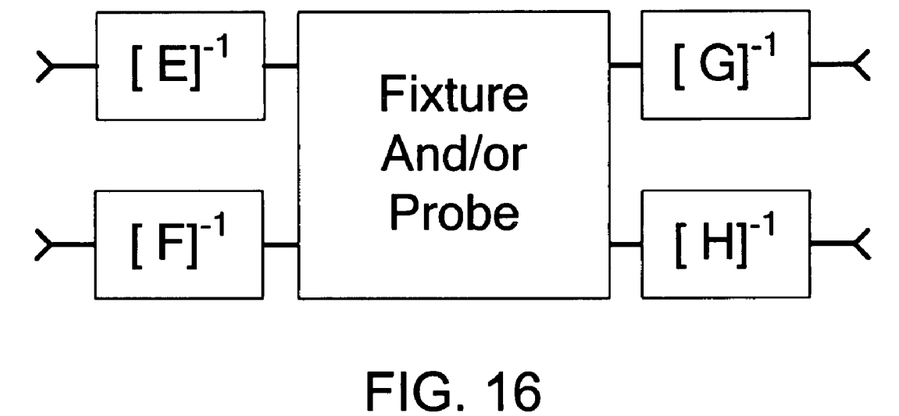
FIG. 16 is a simplified block diagram of four de-embedding 2-port scattering matrices relating to a differential test fixture and/or measurement system.
Figure 17:
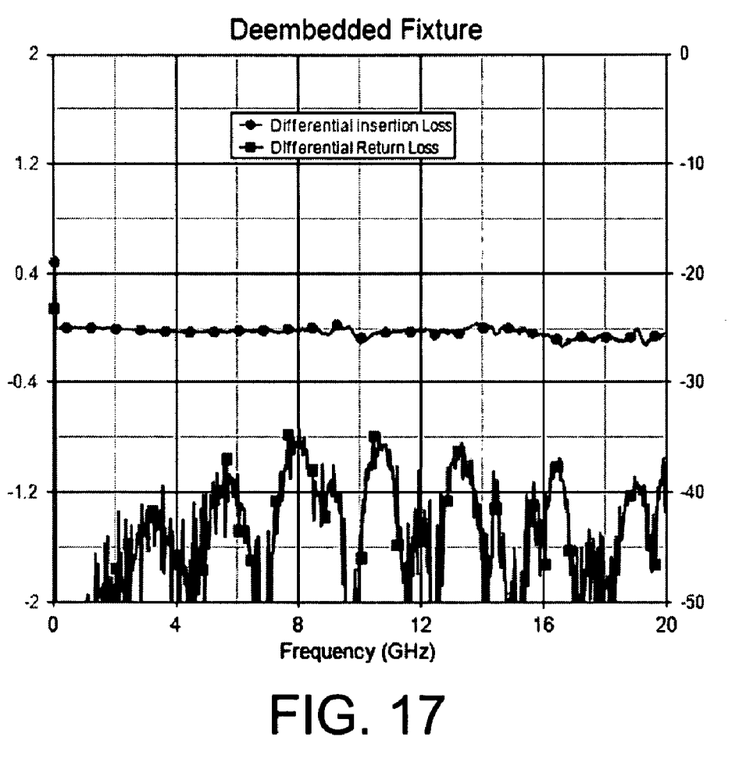
FIG. 17 is a graph showing the de-embedded measurement of an exemplary test fixture with nothing connected at the reference plane, the graph showing very little residual loss.

FIG. 16 shows the measurement of the fixture with and without the measurement system after each transmission line leg 30 has been de-embedded (removed) from the full 4-port measurement. The response is plotted in FIG. 17 showing very little residual insertion loss and good match. More specifically, FIG. 17 shows the de-embedded measurement of the test fixture with nothing connected at the reference plane and showing very little residual loss.

Figure 18:
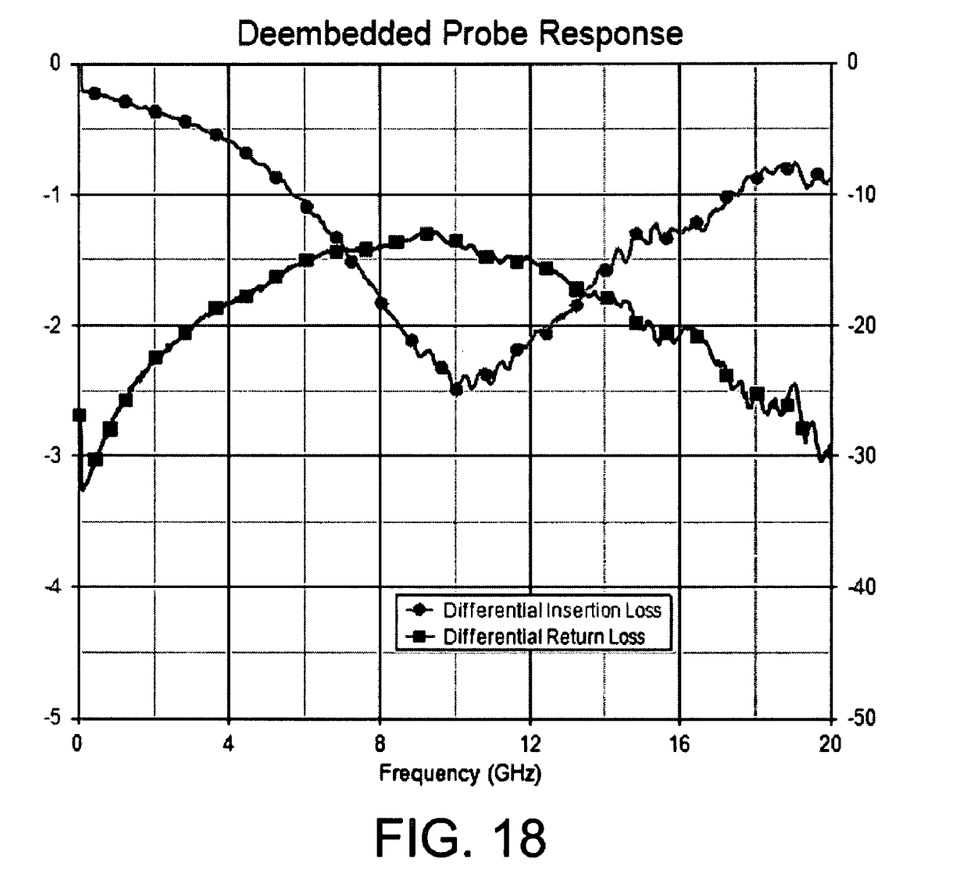
FIG. 18 is a graph showing the de-embedded measurement of an exemplary 11 GHz differential probe showing insertion and return loss in a 100Ω differential system.

A differential probe is connected to the reference plane of the fixture and measured. After de-embedding, the resulting 4-port parameters represent the response of the probe alone without any fixture effects. This parameter set could be used to predict the affect the probe would have on an arbitrary circuit. If desired, the 4×4 matrix could be reduced to represent the differential mode, common mode, or single-ended response (with one input grounded). The resulting insertion and return losses are shown in FIG. 18 assuming a perfectly matched 100Ω system. Specifically, FIG. 18 shows the de-embedded measurement of an exemplary 11 GHz differential probe (and the rest of the measurement system) showing insertion and return loss in a 100Ω differential test fixture.

It should be noted that the present invention may be performed manually, automated, or as a combination of manual and automated steps. For example, in a combination mode, the placements and connections may be performed manually whereas the measurements and calculations may be performed by machines, computers, and or software designed for the purpose.

It should be noted that the order of the steps discussed in the exemplary methods may be changed without affecting the scope of the invention. For example, the combined measurement of the test fixture and measurement system may be measured before or after the test fixture effects of each transmission line leg of the test fixture are calculated.

It should be noted that although exemplary embodiments of the present invention are discussed herein in terms of use with high impedance probes, other probes (e.g. matched impedance or TDR probes) could benefit from the present invention. It should be noted that although exemplary embodiments of the present invention are discussed in terms of use with time domain measurement systems (e.g. oscilloscopes and jitter analyzers) as the testing instruments, alternative testing instruments such as frequency domain measurement systems (e.g. spectrum or network analyzers) could benefit from the present invention. It should be noted that preferred embodiments of the present invention may be used with both differential probes and single-ended probes.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A method to accurately measure the loading impedance of measurement systems using a test fixture, said method comprising the steps of:

(a) providing a test fixture having at least one transmission line, each said at least one transmission line having a port at two ends, said test fixture having a plurality of transmission line legs, each transmission line leg extending between a mid-point reference plane of said at least one transmission line and a port;

(b) measuring characteristics of an unloaded test fixture to obtain scattering parameters of said test fixture, said scattering parameters arranged in at least one test fixture scattering matrix; and (c) calculating scattering parameters of each transmission line leg of said test fixture, said step of calculating scattering parameters of each transmission line leg of said test fixture comprising the steps of:

(i) determining a line impedance of each said transmission line;

(ii) normalizing said at least one test fixture scattering matrix of said unloaded test fixture to the line impedance of each said transmission line to obtain at least one renormalized test fixture scattering matrix of said unloaded test fixture;

(iii) determining at least one input reflection coefficient of a pair of split matrices for each said transmission line using said at least one renormalized test fixture scattering matrix, said at least one input reflection coefficient being parameters of said pair of split matrices, said pair of split matrices having a plurality of parameters;
(iv) solving for remaining parameters of said plurality of parameters of said pair of split matrices using said at least one renormalized test fixture scattering matrix and said at least one input reflection coefficients; and
(v) normalizing said pair of split matrices to 50Ω;
(d) measuring said test fixture loaded with a measurement system to produce a combined measurement of said test fixture and said measurement system; and
(e) removing test fixture effects defined by said scattering parameters of each transmission line leg of said test fixture from said combined measurement by a de-embedding calculation to obtain measurement system effects of said measurement system alone.

2. The method of claim 1, said step of calculating scattering parameters of each transmission line leg of said test fixture further comprising the step of using a splitting algorithm to calculate scattering parameters of each transmission line leg of said test fixture.

3. The method of claim 1, said step of providing a test fixture having at least one transmission line further comprising the step of providing a test fixture having two transmission lines for use with a differential probe.

4. The method of claim 1, said step of removing said test fixture effects from said combined measurement by calculation further comprising the step of de-embedding said test fixture effects from said combined measurement.

5. The method of claim 1, said step of removing said test fixture effects from said combined measurement to obtain measurement system effects further comprising the step of removing said test fixture effects from said combined measurement to obtain added impedance at a point of probing tip contact and to obtain transfer characteristics of said measurement system.

6. The method of claim 1, said step of determining a line impedance of each said transmission line further comprising the steps of: determining an electrical length of said test fixture; transforming an input reflection into the time domain to create an impulse response; applying a time domain window to said impulse response; integrating said impulse response to obtain a step response; and calculating said line impedance from said step response.

7. The method of claim 1, wherein steps (b)-(e) de-embed imperfections of said test fixture such that voltage present at a probing tip contacting said mid-point reference plane can be accurately determined and a transfer characteristic of said measurement system can be determined.

8. A method to accurately measure the loading impedance of measurement systems using a test fixture, said method comprising the steps of:
(a) providing a test fixture having at least one transmission line, each said at least one transmission line having a port at two ends, said test fixture having a plurality of transmission line legs, each transmission line leg extending between a mid-point reference plane of said at least one transmission line and a port;
(b) measuring characteristics of an unloaded test fixture to obtain scattering parameters of said test fixture, said scattering parameters arranged in at least one test fixture scattering matrix;
(c) using a splitting algorithm to calculate scattering parameters of each transmission line leg of said test fixture, said splitting algorithm comprising the steps of:
(i) determining a line impedance of each said transmission line;
(ii) normalizing said at least one test fixture scattering matrix of said unloaded test fixture to the line impedance of each said transmission line to obtain at least one renormalized test fixture scattering matrix of said unloaded test fixture;
(iii) determining at least one input reflection coefficient of a pair of split matrices for each said transmission line using said at least one renormalized test fixture scattering matrix, said at least one input reflection coefficient being parameters of said pair of split matrices, said pair of split matrices having a plurality of parameters;
(iv) solving for remaining parameters of said plurality of parameters of said pair of split matrices using said at least one renormalized test fixture scattering matrix and said at least one input reflection coefficients; and
(v) normalizing said pair of split matrices to 50Ω;
(d) measuring said test fixture loaded with a measurement system to produce a combined measurement of said test fixture and said measurement system; and
(e) removing test fixture effects defined by said scattering parameters of each transmission line leg of said test fixture from said combined measurement by a de-embedding calculation to obtain measurement system effects of said measurement system alone.

9. The method of claim 8, said step of providing a test fixture having at least one transmission line further comprising the step of providing a test fixture having two transmission lines for use with a differential probe.

10. The method of claim 8, said step of removing said test fixture effects from said combined measurement by a de-embedding calculation further comprising the step of de-embedding said test fixture effects from said combined measurement.

11. The method of claim 8, said step of removing said test fixture effects from said combined measurement to obtain measurement system effects further comprising the step of removing said test fixture effects from said combined measurement to obtain added impedance at a point of probing tip contact and to obtain transfer characteristics of said measurement system.

12. The method of claim 8, said step of determining a line impedance of each said transmission line further comprising the steps of: determining an electrical length of said test fixture; transforming an input reflection into the time domain to create an impulse response; applying a time domain window to said impulse response; integrating said impulse response to obtain a step response; and calculating said line impedance from said step response.

13. A system for accurately measuring the loading impedance of measurement systems using a test fixture, said system comprising:
(a) a test fixture having at least one transmission line, each said at least one transmission line having a port at two ends, said test fixture having a plurality of transmission line legs, each transmission line leg extending between a mid-point reference plane of said at least one transmission line and a port;
(b) means for measuring characteristics of an unloaded test fixture to obtain scattering parameters of said test fixture, said scattering parameters arranged in at least one test fixture scattering matrix;
(c) means for calculating scattering parameters of each transmission line leg of said test fixture, said means for calculating scattering parameters of each transmission line leg of said test fixture comprising:

(i) means for determining a line impedance of each said transmission line;

(ii) means for normalizing said at least one test fixture scattering matrix of said unloaded test fixture to the line impedance of each said transmission line to obtain at least one renormalized test fixture scattering matrix of said unloaded test fixture;

(iii) means for determining at least one input reflection coefficient of a pair of split matrices for each said transmission line using said at least one renormalized test fixture scattering matrix, said at least one input reflection coefficient being parameters of said pair of split matrices, said pair of split matrices having a plurality of parameters;

(iv) means for solving for remaining parameters of said plurality of parameters of said pair of split matrices using said at least one renormalized test fixture scattering matrix and said at least one input reflection coefficient; and (v) means for normalizing said pair of split matrices to 50Ω;

(d) means for measuring said test fixture loaded with a measurement system to produce a combined measurement of said test fixture and said measurement system; and (e) means for removing test fixture effects defined by said scattering parameters of each transmission line leg of said test fixture from said combined measurement by a de-embedding calculation to obtain measurement system effects of said measurement system alone.

14. The system of claim 13, said means for calculating scattering parameters of each transmission line leg of said test fixture further comprising means for using a splitting algorithm to calculate scattering parameters of each transmission line leg of said test fixture.

15. The system of claim 13, said test fixture having at least one transmission line further comprising means for providing a test fixture having two transmission lines for use with a differential probe.

16. The system of claim 13, said means for removing said test fixture effects from said combined measurement by a de-embedding calculation further comprising means for de-embedding said test fixture effects from said combined measurement.

17. The system of claim 13, said means for removing said test fixture effects from said combined measurement to obtain measurement system effects further comprising means for removing said test fixture effects from said combined measurement to obtain added impedance at a point of probing tip contact and to obtain transfer characteristics of said measurement system.

18. The system of claim 13, said means for determining a line impedance of each said transmission line further comprising: determining an electrical length of said test fixture; transforming an input reflection into the time domain to create an impulse response; applying a time domain window to said impulse response; integrating said impulse response to obtain a step response; and calculating said line impedance from said step response.

* * * * *

UNITED STATES PATENT AND TRADEMARK OFFICE
CERTIFICATE OF CORRECTION

PATENT NO. : 7,865,319 B1  Page 1 of 1
APPLICATION NO. : 11/998523
DATED : January 4, 2011
INVENTOR(S) : Jacobs et al.

It is certified that error appears in the above-identified patent and that said Letters Patent is hereby corrected as shown below:

Drawings,
Please replace FIGS. 1 and 2 with the following FIGS. 1 and 2.

FIG. 1

FIG. 2

Signed and Sealed this
Twenty-ninth Day of March, 2011

David J. Kappos
*Director of the United States Patent and Trademark Office*